United States Patent
Hsu et al.

(10) Patent No.: US 7,863,729 B2
(45) Date of Patent: Jan. 4, 2011

(54) CIRCUIT BOARD STRUCTURE EMBEDDED WITH SEMICONDUCTOR CHIPS

(75) Inventors: Shih Ping Hsu, Hsin-chu (TW); Chung Cheng Lien, Hsin-Chu (TW); Shang Wei Chen, Hsin-Chu (TW)

(73) Assignee: Unimicron Technology Corp., Taoyuan (TW)

( * ) Notice: Subject to any disclaimer, the term of this patent is extended or adjusted under 35 U.S.C. 154(b) by 84 days.

(21) Appl. No.: 12/427,668

(22) Filed: Apr. 21, 2009

(65) Prior Publication Data

US 2009/0200658 A1 Aug. 13, 2009

Related U.S. Application Data

(62) Division of application No. 11/544,199, filed on Oct. 5, 2006, now abandoned.

(30) Foreign Application Priority Data

Feb. 9, 2006 (TW) .............................. 95104315 A

(51) Int. Cl.
*H01L 23/12* (2006.01)
*H01L 23/053* (2006.01)

(52) U.S. Cl. ................. 257/700; 257/686; 257/736; 438/109

(58) Field of Classification Search ................. 257/700, 257/686, 736, 748, 781, 774, E23.174, E23.004; 438/109
See application file for complete search history.

(56) References Cited

U.S. PATENT DOCUMENTS 6,964,887 B2* 11/2005 Akagawa .................... 438/126
7,435,910 B2* 10/2008 Sakamoto et al. ........... 174/260

* cited by examiner

*Primary Examiner*—Theresa T Doan
(74) *Attorney, Agent, or Firm*—Sawyer Law Group, P.C.

(57) ABSTRACT

A circuit board structure embedded with semiconductor chips is proposed. A semiconductor chip is received in a cavity of a supporting board. A dielectric layer and a circuit layer are formed on the supporting board and the semiconductor chip. A plurality of hollow conductive vias are formed in the dielectric layer for electrically connecting the circuit layer to the semiconductor chip. By providing the hollow conductive vias of present invention, the separating results of different coefficients of expansion and thermal stress are prevented, and thus electrical function of products is ensured.

10 Claims, 4 Drawing Sheets

CIRCUIT BOARD STRUCTURE EMBEDDED WITH SEMICONDUCTOR CHIPS

CROSS-REFERENCE TO RELATED APPLICATION

This application is a divisional of copending application U.S. Ser. No. 11/544,199, filed on Oct. 5, 2006.

This application claims benefit under 35 USC 119 to Taiwan Application No. 095104315, filed Feb. 9, 2006.

FIELD OF THE INVENTION

This invention relates to circuit board structures, and more particularly, to a circuit board structure having hollow conductive vias for electrically connecting semiconductor chips and circuitry embedded in the circuit board structure.

BACKGROUND OF THE INVENTION

With the rapid development of semiconductor packaging techniques, semiconductor devices are brought to the market in various package types. In a process to manufacturing a semiconductor device, first a semiconductor chip is installed on a package substrate or a lead frame, then the semiconductor chip is electrically connected to the package substrate or the lead frame, and finally an encapsulant is covered on the semiconductor chip and the package substrate or the lead frame. A ball grid array (BGA) technique is one of the most advanced semiconductor packaging techniques. The BGA technique includes installing a semiconductor chip on a package substrate, and installing a plurality of array disposed solder balls on a rear surface of the package substrate by using a self-alignment technique. Therefore, a number of I/O connection terminals per unit area on a carrying member carried with the semiconductor chip is increased, and an integration demand for semiconductor chips is requested. The semiconductor chip is electrically connected via these solder balls to external devices.

The semiconductor packaging technique of the prior art, when manufacturing the semiconductor device, first adheres the semiconductor chip to a front surface of the package substrate, then performs wire bonding or flip chip packaging process on the semiconductor chip, and finally installs on the rear surface of the package substrate the solder balls, which electrically connect the semiconductor chip to the external devices. Although the semiconductor device manufactured by such a semiconductor package technique has increased number of I/O connection terminals and meets the requirement of high pin count, the electric characteristics of the semiconductor device, when operating at a high frequency, are severely restricted due to too long a conductive connection route. Moreover, the semiconductor packaging technique of the prior art needs to perform many times of connecting interface processes, so that a manufacturing process for the semiconductor device is complicated.

In order to solve the drawbacks of the prior art, R&D personnel for the semiconductor device try not to install the semiconductor chip on the package substrate, but embed the semiconductor chip into the package substrate instead, to shorten the conductive connection route, reduce signal loss and distortion, and improve the performance of the semiconductor device while operating at the high frequency.

FIG. 1 is a cross sectional view of a package member having a substrate embedded with semiconductor chips according to the prior art. The package member comprises a carrying board 10. At least a cavity 100a is formed on a surface 100 of the carrying board 10. The package member further comprises at least a semiconductor chip 11 installed on the carrying board 10 and received in the cavity 100a. A plurality of electrode pads 110 are formed on the semiconductor chip 11. The package member further comprises a circuit build-up structure 12 formed on the carrying board 10 and electrically connected via a plurality of conductive vias 120 to the electrode pads 110.

The semiconductor chip 11 comprises an active surface 11a and a non-active surface 11b opposing to the active surface 11a. The electrode pads 110 are installed on the active surface 11a. The non-active surface 11b is formed in the cavity 100a and adhered to the carrying board 10 by the use of an adhesive 13.

The circuit build-up structure 12 comprises at least a dielectric layer 121, a circuit layer 122 interlacing with the dielectric layer 121, and a plurality of conductive vias 120 passing through the dielectric layer 121 and electrically connected to the circuit layer 122 and the electrode pads 110. A plurality of electric connection terminals 123 are further formed on an outmost surface of the circuit layer 122 of the circuit build-up structure 12. A solder mask 124 is further formed on the outmost surface of the circuit layer 122. The solder mask 124 comprises a plurality of openings for exposure of the electric connection terminals 123. The electric connection terminals 123 are installed for plantation of a plurality of conductive elements such as solder balls 125. Therefore, the semiconductor chip 11 installed on the carrying board 10 and received in the cavity 100a can be electrically connected via the electrode pads 110, the circuit build-up structure 12 and the solder balls 125 to the external device.

As described above, in the package member of the prior art, the circuit layer 122 is electrically connected via the conductive vias 120 directly to the semiconductor chip 11, and the conductive vias 120 are formed by plated copper in vias formed in an insulating layer, the vias being fully filled by the plated copper. However, because coefficients of thermal expansion (CTE) of composed components (such as the insulating layer and a protection layer for protecting the semiconductor chip) surrounding the conductive vias 120 are mismatched, thermal expansion of the composed components are different from each other. In result, a thermal stress is produced in the package member, the formed circuit structure is likely separated from the electrode pads 110 of the semiconductor chip 11 due to the thermal stress, and the package member is thus malfunctioned.

Moreover, in order to satisfy the demand of fine pitch and reduction of signal transmission route, the conductive vias 120 for connection of circuitry are formed to have a stack structure. However, because the composed units surrounding the conductive vias 120 have different CTEs, and thermal stress produced in the package member are therefore mismatched, the circuit structure is easily separated from the electrode pads 120 of the semiconductor chip 11. In result, the demand of fine pitch can not be attained and the package member has poor reliability.

Therefore, how to provide an electric connection structure of a circuit board embedded with semiconductor chips to overcome the drawbacks of the prior art has becoming one of the most urgent issues in the art.

SUMMARY OF THE INVENTION

In views of the above-mentioned problems of the prior art, it is a primary objective of the present invention to provide a circuit board structure embedded with semiconductor chips, for improving electric characteristics of a product having the circuit board structure and preventing electric pads of the semiconductor chips from being separated from a circuit build-up structure.

It is another objective of the present invention to provide a circuit board structure embedded with semiconductor chips, for increasing the yield and reliability of the product.

It is a further objective of the present invention to provide a circuit board structure embedded with semiconductor chips. Compared to the prior art, the circuit board structure of the present invention has a shorter electric transmission route and diversified circuit layout.

To achieve the above-mentioned and other objectives, a circuit board structure embedded with semiconductor chips. The circuit board structure includes a supporting board having at least a cavity; at least a semiconductor chip embedded in the cavity of the supporting board, the semiconductor chip having an active surface having a plurality of the electrode pads; a protection layer formed on the active surface of the semiconductor chip, the protection layer having a plurality of openings corresponding to the electrode pads for exposure of the electrode pads of the semiconductor chip; a metal layer formed on surfaces of the electrode pads exposed from the openings of the protection layer; a dielectric layer formed on the supporting board and the protection layer surface, the dielectric layer having another plurality of openings corresponding to the electrode pads for exposure of the metal layer on the electrode pads of the semiconductor chip; a circuit layer formed on the dielectric layer, a plurality of hollow conductive vias being formed in the another openings of the dielectric layer and electrically connected to the circuit layer, allowing the circuit layer to be electrically connected via the hollow conductive vias to the metal layer on the electrode pads of the semiconductor chip.

According to another embodiment, a buffer metal layer is further installed between the metal layer and the hollow conductive vias.

According to another embodiment, the circuit board structure further includes a circuit build-up structure formed on the dielectric layer and circuit layer. A plurality of fully-plated metal vias are formed in the circuit build-up structure and electrically connected to the circuit layer. At least an electrical conductive pad is formed on the circuit build-up structure. The circuit build-up structure includes a dielectric layer, a circuit layer stacked on the dielectric layer, and a fully-plated metal via formed in the dielectric layer. The circuit build-up structure surface includes a solder mask having a plurality of openings for exposure of the electrical conductive pad of the circuit build-up structure.

According to another embodiment, the fully-plated metal via of the circuit build-up structure is extended to a bottom portion of the hollow conductive vias of the circuit layer.

In summary, in the circuit board structure embedded with semiconductor chips the semiconductor chips are received in the cavities of the supporting board, then a circuit manufacturing process is preformed on the supporting board and the semiconductor chips to form the dielectric layer and the circuit layer, and last the hollow conductive vias are formed in the dielectric layer for electrically connecting the circuit layer to the electrode pads of the semiconductor chips. Therefore, through the installation of the hollow conductive vias, the composed units, such as the dielectric layer and the protection layer, both of which surround the hollow conductive vias, have approximately the same CTE, solve the problem that the dielectric layers formed in and outside of the hollow conductive vias have mismatched CTE. Moreover, because the dielectric layers inside and outside of the hollow conductive vias are made of the same material, a thermal stress is greatly reduced, ensuring that the semiconductor chips will not be separated from the circuit build-up structure formed on the semiconductor chips and improve the electric quality of an electric produce having the circuit board structure.

Further, a circuit build-up structure can be further formed on the dielectric layer and the circuit layer by using a circuit build-up manufacturing process, and the fully-plated metal vias of the circuit build-up structure are designed to extend to the hollow conductive vias of the circuit layer, so as to form a structure having stacked vias, which can be applied to a fine pitch circuit board. Therefore, the electric connection route is shortened, and a circuit layout is diversified.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

The following illustrative embodiments are provided to illustrate the disclosure of the present invention, these and other advantages and effects can be apparently understood by those in the art after reading the disclosure of this specification. The present invention can also be performed or applied by other different embodiments. The details of the specification may be on the basis of different points and applications, and numerous modifications and variations can be devised without departing from the spirit of the present invention.

First Embodiment

Figure 1:
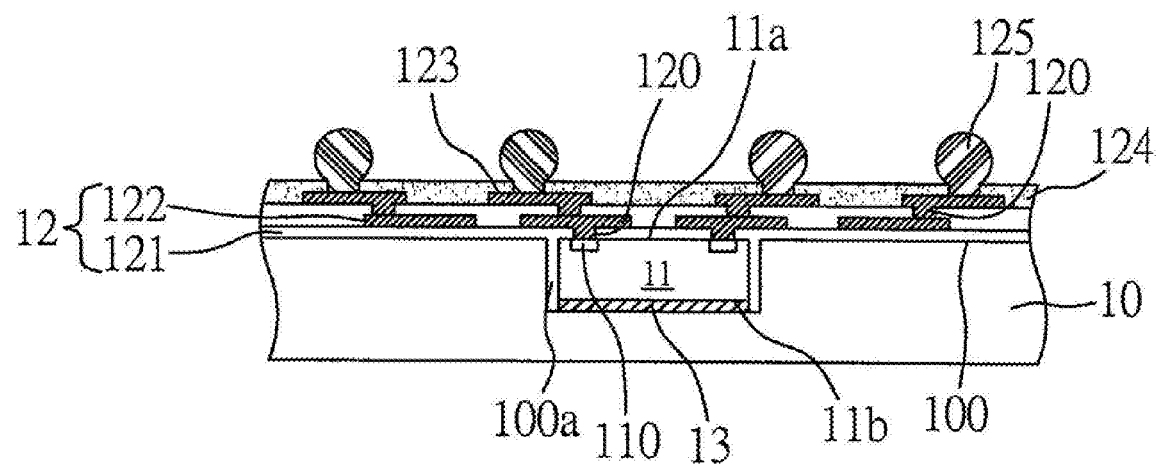
FIG. 1 is a cross sectional view of a package member having a substrate embedded with semiconductor chips according to the prior art.
Figure 2:
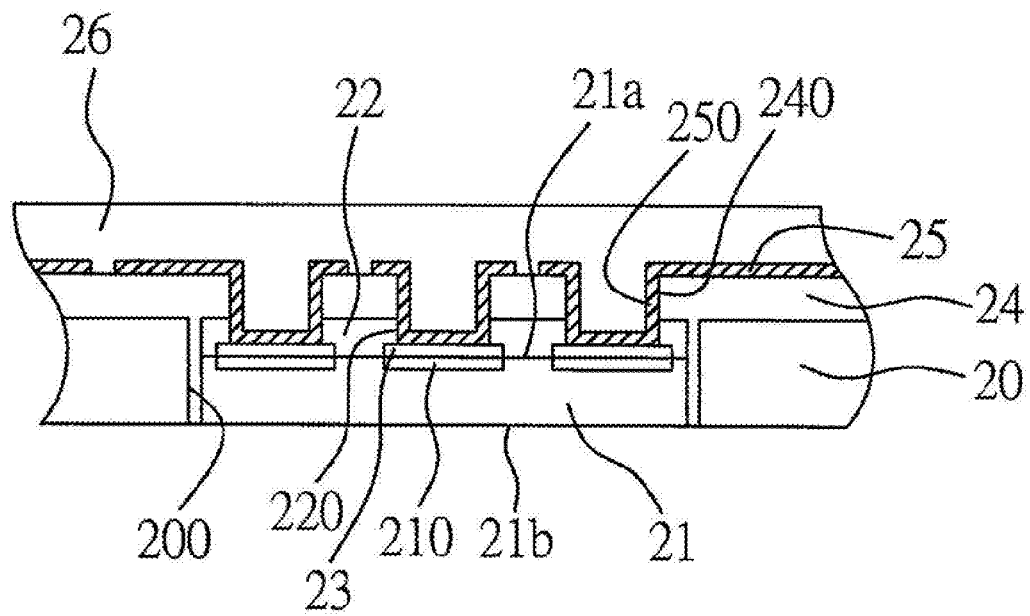
FIG. 2 is a cross sectional view of a circuit board structure embedded with semiconductor chips of a first embodiment according to the present invention.

FIG. 2 is a cross sectional view of a circuit board structure embedded with semiconductor chips of a first embodiment according to the present invention. The circuit board structure comprises a supporting board 20, at least a semiconductor chip 21, a protection layer 22, a metal layer 23, a dielectric layer 24, a circuit layer 25 and a hollow conductive via 250.

The supporting board 20 is a circuit board or a core board, which the circuit board has completed a former circuit manufacturing process. The core board is made of a metal or non-metal material. At least a cavity 200 is formed in the supporting board 20 for receiving the semiconductor chip 21.

The semiconductor chip 21 comprises an active surface 21a and a non-active surface 21b opposing to the active surface 21a. A plurality of the electrode pads 210 are formed on the active surface 21a.

The protection layer 22 is formed on the active surface 21a of the semiconductor chip 21. A plurality of openings 220 are formed in the protection layer 22 and positionally corresponding to the electrode pads 210 for exposure of the electrode pads 210.

The metal layer 23 is formed on surfaces of the electrode pads 210 formed in the openings 220 of the protection layer 22. The metal layer 23 is a barrier layer such as a nickel/gold layer, for protecting the electrode pads 210, which are installed under the metal layer 23.

The dielectric layer 24 is formed on the supporting board 20 and the active surface 21a of the semiconductor chip 21. Another plurality of openings 240 are formed in the dielectric layer 24 and positionally corresponding to the electrode pads 210 for exposure of the electrode pads 210. According to the first embodiment, the dielectric layer 24 comprises epoxy resin, polyimide, cyanate ester, glass fiber, bismaleimide Triazine (BT) or a combination of epoxy resin and fiber glass.

The circuit layer 25 is formed on the dielectric layer 24. A plurality of hollow conductive vias 250 are formed in the openings 240 of the dielectric layer 24 and electrically connected to the circuit layer 25. Therefore, the circuit layer 25 can be electrically connected via the hollow conductive vias 250 to the electrode pads 210 of the semiconductor chip 21. The circuit layer 25 is a patterned copper layer, which is manufactured by a convention process known by those skilled, further description of the patterned copper layer hereby omitted.

The circuit board structure further comprises a solder mask 26. Another plurality of openings (not shown) are formed in the solder mask 26 for exposure of electrical conductive pads (not shown) formed in the circuit layer 25. The hollow conductive vias 250 are fully filled by solder mask 26. A plurality of conductive components such as solder balls are then installed on the electrical conductive pads. Therefore, the semiconductor chip 21 can be electrically connected to the external devices.

One of the characteristics of the circuit board structure embedded with semiconductor chips of the present invention is that a conductive structure formed in the openings 240 of the dielectric layer 24 is the hollow conductive vias 250. The installation of the hollow conductive vias 250 make the dielectric layer 24, the solder mask 26 and the protection layer 22, all of which surround the hollow conductive vias 250, have matched CTE, so that the thermal stress is reduced, the circuit layer 25 is prevented from being separated from the electrode pads 210 of the semiconductor chip 21, the circuit board structure is ensured to function normally. Preferably, the solder mask 26, the dielectric layer 24 and the protection layer 22 are made of materials having approximately the same CTE. Thus, areas surrounding the hollow conductive via 250 have approximately the same CTE, and the thermal stress generated by the circuit board structure in operation is greatly reduced.

Second Embodiment

Figure 3:
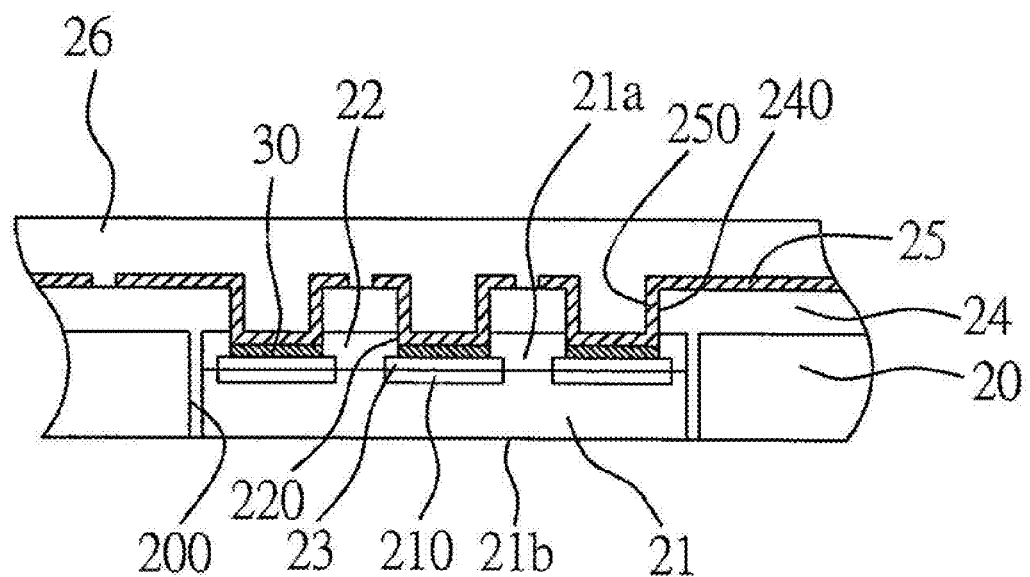
FIG. 3 is a cross sectional view of a circuit board structure embedded with semiconductor chips of a second embodiment according to the present invention.

FIG. 3 is a cross sectional view of a circuit board structure embedded with semiconductor chips of a second embodiment according to the present invention.

Compared with the circuit board structure of the first embodiment, the circuit board structure of the second embodiment further comprises a buffer metal layer 30.

The buffer metal layer 30 is formed between the hollow conductive via 250 and the metal layer 23. According to the second embodiment, the buffer metal layer 30 is a copper layer. Therefore, if the metal layer 23 in not thick enough, the thickened buffer metal layer 30 can serve as a stop layer for a laser ablating process for forming the openings (i.e. blind vias) of the dielectric layer 24, and the electrode pads 210 covered under the buffer metal layer 30 can be protected from damages.

Third Embodiment

Figure 4:
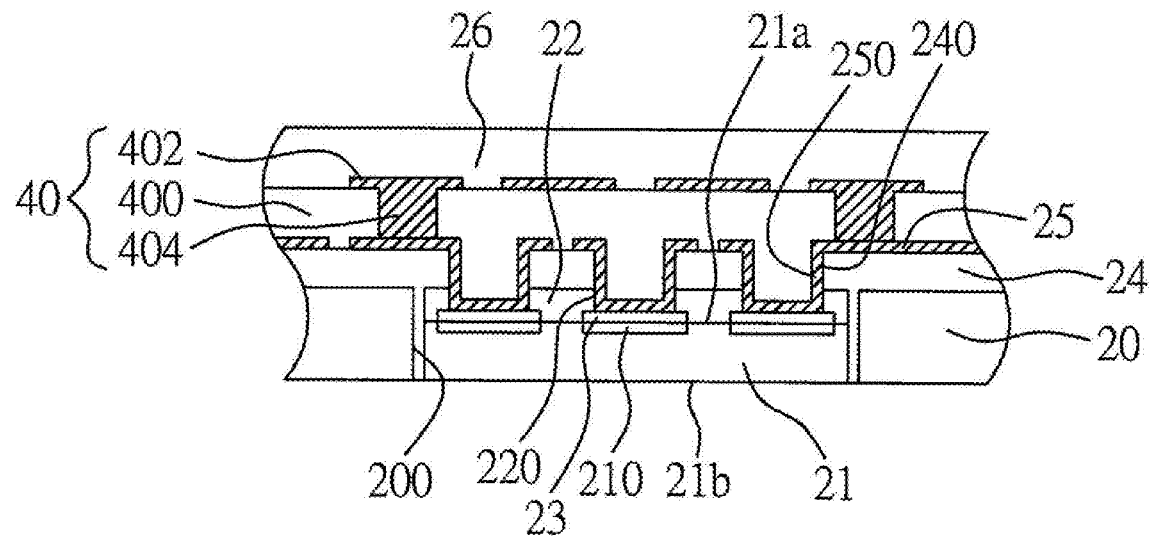
FIG. 4 is a cross sectional view of a circuit board structure embedded with semiconductor chips of a third embodiment according to the present invention.

FIG. 4 is a cross sectional view of a circuit board structure embedded with semiconductor chips of a third embodiment according to the present invention.

Compared with the circuit board structure of the first embodiment, the circuit board structure of the third embodiment further comprises a circuit build-up structure 40 formed on the dielectric layer 24 and the circuit layer 25.

The circuit build-up structure 40 comprises at least a dielectric layer 400, a circuit layer 402 stacked on the dielectric layer 400, and a fully-plated metal via 404 formed in the dielectric layer 400 for electrically connecting the circuit layer 402 to the circuit layer 25. Of course, another hollow conductive via (not shown) can be used for serving as an electric signal transmission route between the circuit layer 402 and the circuit layer 25.

The dielectric layer 400 is fully filled in the hollow conductive via 250. Through the design of the hollow conductive via 250, the dielectric layers 24 and 400 and the protection layer 22 have approximately the same CTE, preventing the circuit layer 402 from being separated from the electrode pads 210 due to a thermal stress resulting from the dielectric layers 24 and 400 and the protection layer 22 if the dielectric layers 24 and 400 and the protection layer 22 have mismatched CTEs.

The circuit build-up structure 40 further comprises a plurality of electrical conductive pads (not shown) formed on the circuit layer 402. A solder mask 26 is further formed on an external surface of the circuit build-up structure 40 for protecting circuitry under the solder mask 26. A plurality of openings (not shown) are further formed for exposure of the electrical conductive pads of the circuit build-up structure 40. Conductive elements (such as solder balls) can then be installed on the electrical conductive pads, for completing the electrical conductive of the semiconductor chip 21 to an external device.

Fourth Embodiment

Figure 5:
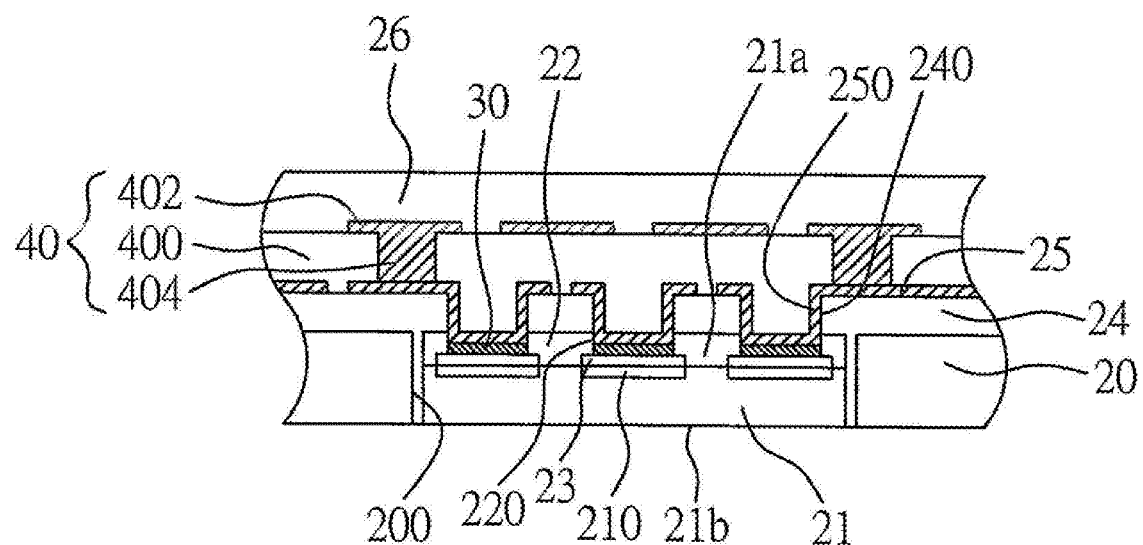
FIG. 5 is a cross sectional view of a circuit board structure embedded with semiconductor chips of a fourth embodiment according to the present invention.

FIG. 5 is a cross sectional view of a circuit board structure embedded with semiconductor chips of a fourth embodiment according to the present invention.

Compared with the circuit board structure of the third embodiment, the circuit board structure of the fourth embodiment further comprises a buffer metal layer 30.

The buffer metal layer 30 is formed between the metal layer 23 and the hollow conductive via 250. The buffer metal layer 30 has functionalities the same as those of the buffer metal layer 30 of the second embodiment, further description hereby omitted.

Fifth Embodiment

Figure 6:
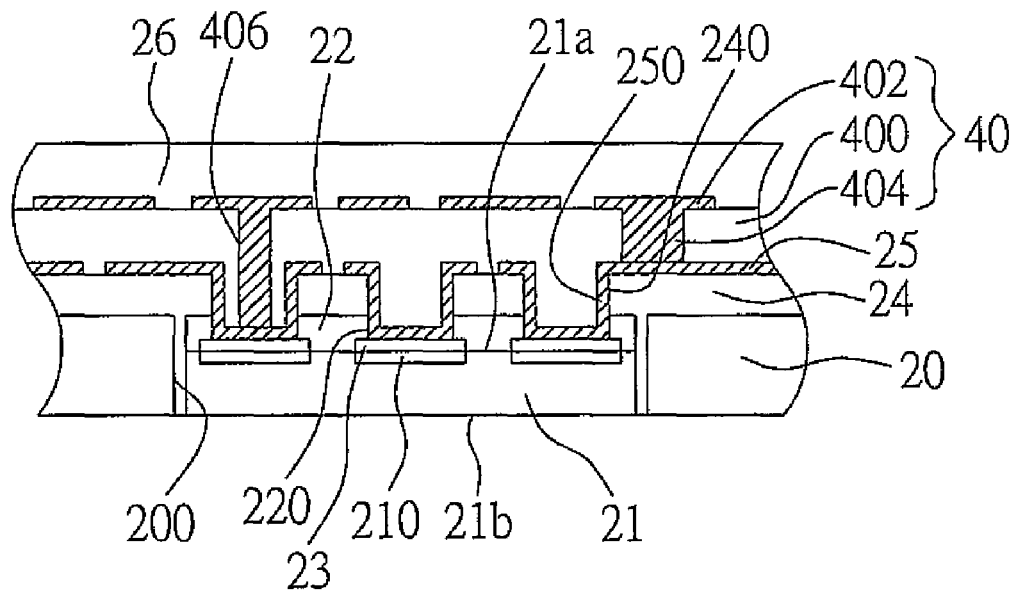
FIG. 6 is a cross sectional view of a circuit board structure embedded with semiconductor chips of a fifth embodiment according to the present invention.

FIG. 6 is a cross sectional view of a circuit board structure embedded with semiconductor chips of a fifth embodiment according to the present invention.

Compared with the circuit board structure of the third embodiment, the circuit board structure of the fifth embodiment further comprises another fully-plated metal via 406.

The another fully-plated metal via 406 is electrically connected to a bottom portion of the hollow conductive vias 250 formed in the circuit layer 25 in the beginning, so as to form a structure having stacked vias, which can be applied to a fine pitch circuit board. Therefore, the electric connection route is shortened, and a circuit layout is diversified.

Sixth Embodiment

Figure 7:
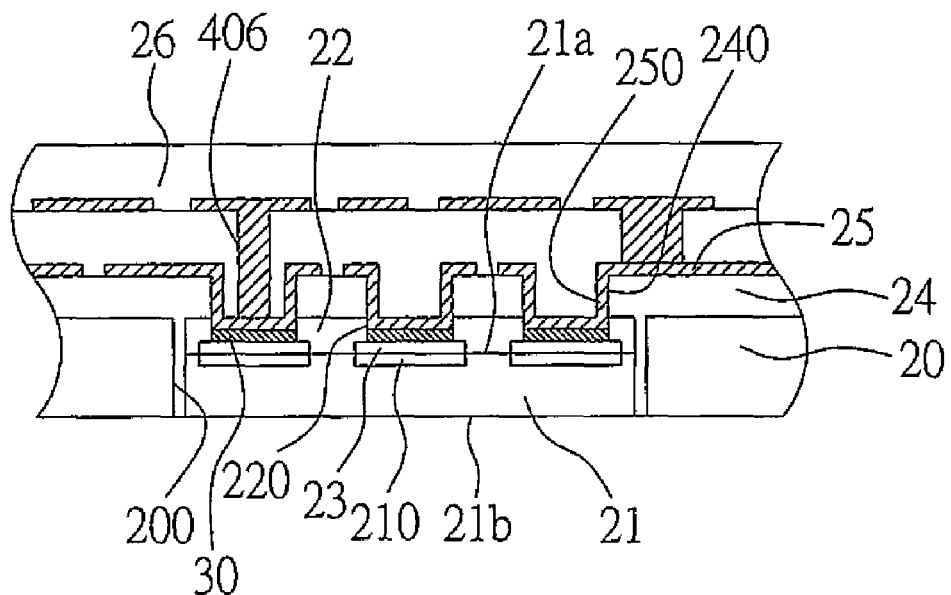
FIG. 7 is a cross sectional view of a circuit board structure embedded with semiconductor chips of a sixth embodiment according to the present invention.

FIG. 7 is a cross sectional view of a circuit board structure embedded with semiconductor chips of a sixth embodiment according to the present invention.

Compared with the circuit board structure of the fifth embodiment, the circuit board structure of the sixth embodiment further comprises a buffer metal layer 30.

The buffer metal layer 30 is formed between the metal layer 23 and the hollow conductive via 250. The buffer metal layer 30 has functionalities the same as those of the buffer metal layer 30 of the second embodiment, further description hereby omitted.

In summary, in the circuit board structure embedded with semiconductor chips the semiconductor chips are received in the cavities of the supporting board, then a circuit manufacturing process is preformed on the supporting board and the semiconductor chips to form the dielectric layer and the circuit layer, and last the hollow conductive vias are formed in the dielectric layer for electrically connecting the circuit layer to the electrode pads of the semiconductor chips. Therefore, through the installation of the hollow conductive vias, the composed units, such as the dielectric layer and the protection layer, both of which surround the hollow conductive vias, have approximately the same CTE, solve the problem that the dielectric layers formed in and outside of the hollow conductive vias have mismatched CTE. Moreover, because the dielectric layers inside and outside of the hollow conductive vias are made of the same material, a thermal stress is greatly reduced, ensuring that the semiconductor chips will not be separated from the circuit build-up structure formed on the semiconductor chips and improve the electric quality of an electric produce having the circuit board structure.

Further, a circuit build-up structure can be further formed on the dielectric layer and the circuit layer by using a circuit build-up manufacturing process, and the fully-plated metal vias of the circuit build-up structure are designed to extend to the hollow conductive vias of the circuit layer, so as to form a structure having stacked vias, which can be applied to a fine pitch circuit board. Therefore, the electric connection route is shortened, and a circuit layout is diversified.

The foregoing descriptions of the detailed embodiments are only illustrated to disclose the features and functions of the present invention and not restrictive of the scope of the present invention. It should be understood to those in the art that all modifications and variations according to the spirit and principle in the disclosure of the present invention should fall within the scope of the appended claims.

What is claimed is:

1. A circuit board structure embedded with semiconductor chips, the circuit board structure comprising:
    a supporting board having at least a cavity;
    at least a semiconductor chip embedded in the cavity of the supporting board, the semiconductor chip having an active surface having a plurality of the electrode pads;
    a protection layer formed on the active surface of the semiconductor chip, the protection layer having a plurality of openings corresponding to the electrode pads for exposure of the electrode pads of the semiconductor chip;
    a metal layer formed on surfaces of the electrode pads exposed from the openings of the protection layer;
    a dielectric layer formed on the supporting board and the protection layer, the dielectric layer having another plurality of openings corresponding to the electrode pads for exposure of the metal layer on the electrode pads of the semiconductor chip;
    a circuit layer formed on the dielectric layer, a plurality of hollow conductive vias being formed in the another openings of the dielectric layer and electrically connected to the circuit layer, allowing the circuit layer to be electrically connected via the hollow conductive vias to the metal layer on the electrode pads of the semiconductor chip; and
    a circuit build-up structure formed on the dielectric layer and the circuit layer, a plurality of fully-plated metal vias being formed in the circuit build-up structure, an electrical conductive pad being formed on the circuit build-up structure, wherein a portion of the fully-plated metal vias are electrically connected to the circuit layer, and rest of the fully-plated metal vias are extended to a bottom portion of the hollow conductive vias of the circuit layer.

2. The circuit board structure of claim 1, wherein supporting board is a circuit board or a core board, which the circuit board has completed a former circuit manufacturing process.

3. The circuit board structure of claim 2, wherein the core board is made of metal or nonmetal materials.

4. The circuit board structure of claim 1 further comprising a buffer metal layer formed between the metal layer and the hollow conductive vias.

5. The circuit board structure of claim 4 further comprising a circuit build-up structure formed on the dielectric layer and the circuit layer, a plurality of fully-plated metal vias being formed in the circuit build-up structure and electrically connected to the circuit layer, an electrical conductive pad being formed on the circuit build-up structure.

6. The circuit board structure of claim 5 further comprising a solder mask formed on an external surface of the circuit build-up structure, the solder mask having a mask opening for exposure of the electrical conductive pad of the circuit build-up structure.

7. The circuit board structure of claim 5, wherein the circuit build-up structure comprises at least a dielectric layer, a circuit layer stacked on the dielectric layer, and a fully-plated metal via formed in the dielectric layer.

8. The circuit board structure of claim 5, wherein the fully-plated metal via is extended to a bottom portion of the hollow conductive vias of the circuit layer.

9. The circuit board structure of claim 1 further comprising a solder mask formed on an external surface of the circuit build-up structure, the solder mask having a mask opening for exposure of the electrical conductive pad of the circuit build-up structure.

10. The circuit board structure of claim 1, wherein the circuit build-up structure comprises at least a dielectric layer, a circuit layer stacked on the dielectric layer, and a fully-plated metal via formed in the dielectric layer.

* * * * *